(12) United States Patent
Kawai et al.

(10) Patent No.: US 7,990,211 B2
(45) Date of Patent: Aug. 2, 2011

(54) CLASS D AMPLIFIER CIRCUIT

(75) Inventors: Hirotaka Kawai, Hamamatsu (JP);
Nobuaki Tsuji, Hamamatsu (JP);
Yasuomi Tanaka, Hamamatsu (JP)

(73) Assignee: Yamaha Corporation, Hamamatsu-shi (JP)

( * ) Notice: Subject to any disclaimer, the term of this patent is extended or adjusted under 35 U.S.C. 154(b) by 52 days.

(21) Appl. No.: 12/218,084

(22) Filed: Jul. 11, 2008

(65) Prior Publication Data

US 2009/0027121 A1 Jan. 29, 2009

(30) Foreign Application Priority Data

Jul. 13, 2007 (JP) ................................. 2007-184006

(51) Int. Cl.
*H03F 3/38* (2006.01)
(52) U.S. Cl. ......................................................... 330/10
(58) Field of Classification Search .................... 330/10, 330/207 A, 251
See application file for complete search history.

(56) References Cited

U.S. PATENT DOCUMENTS

| | | | |
|---|---|---|---|
| 6,294,954 B1 * | 9/2001 | Melanson | 330/10 |
| 6,518,838 B1 | 2/2003 | Risbo | |
| 7,167,046 B2 | 1/2007 | Maejima | |
| 7,265,617 B2 | 9/2007 | Ohkuri | |
| 7,295,063 B2 * | 11/2007 | Kurokawa | 330/10 |
| 2006/0012428 A1 | 1/2006 | Ohkuri | |
| 2007/0116109 A1 | 5/2007 | Stanley | |

FOREIGN PATENT DOCUMENTS

| | | |
|---|---|---|
| JP | 2003-510878 (A) | 3/2003 |
| JP | 2005210280 (A) | 8/2005 |
| JP | 2006-033499 (A) | 2/2006 |
| JP | 2006-042296 | 2/2006 |
| JP | 2006-042296 (A) | 2/2006 |
| WO | WO 01/22585 A1 | 3/2001 |

OTHER PUBLICATIONS

Extended European Search Report for Application No. 08012497.7, issued Nov. 20, 2008 (6 pgs.).
Japanese Patent Office: "Notification of Reasons for Refusal" for Patent Application No. 2007-184006, (Drafting Date: Jan. 5, 2010; 7 pgs.)
Korean Intellectual Property Office, "Notice of Preliminary Rejection," Korean Patent Application No. 10-2008-0067797; dated Feb. 22, 2010, 4 pages.
Korean Intellectual Property Office "Notice of Preliminary Rejection" dated Sep. 14, 2010 Application No. 10-2008-0067797 of Yamaha Corporation, 3 pages.
The State Intellectual Property Office of the People'S Republic of China, "Notification of First Office Action" Chinese Patent Application No. 200810135805.1 dated Dec. 23, 2010, 4 pages.
European Patent Office "Communication Pursuant to Article 94(3) EPC" dated Jul. 19, 2010 for Application.No. 08012497.7-1233, 5 pages.

* cited by examiner

*Primary Examiner* — Robert Pascal
*Assistant Examiner* — Khiem D Nguyen
(74) *Attorney, Agent, or Firm* — Pillsbury Winthrop Shaw Pittman LLP

(57) ABSTRACT

A pulse monitor circuit detects the presence or non-presence of the output pulses output from an output stage circuit. The pulse monitor circuit outputs an up signal to the up/down counter when the output pulses do not exist at all and outputs a down signal to the up/down counter when the output pulses exist. The up/down counter outputs a signal for increasing the delay amount of a delay amount variable circuit when a count value is large, that is, when the output pulses disappear. In contrast, when the count value is small, that is, when the output pulses exist, the counter outputs the signal for reducing the delay amount of the delay amount variable circuit.

13 Claims, 4 Drawing Sheets

CLASS D AMPLIFIER CIRCUIT

BACKGROUND OF THE INVENTION

The present invention relates to a class D amplifier circuit and, in particular, relates to a class D amplifier circuit which can realize the reduction of distortion and power loss at the time of inputting a small signal.

The class D amplifier circuit converts an input signal into a pulse width modulation signal having constant amplitude and amplifies the power of the pulse width modulation signal. The class D amplifier circuit is used for amplifying the power of an audio signal. Since the class D amplifier circuit operates based on binary values, transistor loss can be reduced to a large extent and so a high efficiency can be realized advantageously.

Such a kind of the class D amplifier circuit includes an integration circuit for integrating an input signal, a comparison circuit for comparing the output signal of the integration circuit with a predetermined triangular signal, and a pulse width amplifier for amplifying the output signal of the comparison circuit to thereby output as pulse signal. The output signal of the pulse width amplifier is fed back to the input side of the integration circuit. The output signal of the pulse width amplifier passes a low pass filter configured by a coil and a capacitor and so obtained as an analog signal for driving a load such as a speaker. In recent years, a filter-less class D amplifier circuit has been realized in which a low-pass filter is eliminated.

As described in JP-A-2006-42296, in order to avoid the power loss at the time where the input signal has no signal component, that is, at the time of no input-signal, the class D amplifier circuit employs a differential input system and a delay circuit to thereby set a duty ratio of an output pulse at the time of no input-signal to several percent. FIG. 4 is a block diagram showing such a class D amplifier circuit 200. For the sake of convenience, this figure shows only the main portion of the amplifier, and a feedback circuit and an integration circuit etc. are omitted. The class D amplifier circuit 200 compares an input signal Vi+ to a positive input terminal and an input signal Vi− to a negative input terminal with a triangular wave output from a triangular wave generation circuit 20 by using comparators 12a, 12b, respectively to thereby pulse-width modulate the input signals.

As shown in FIG. 5, at the time of no input-signal, each of the output signal A of the comparator 12a and the output signal B of the comparator 12b is a pulse signal having a duty ratio of 50%. When these pulse signals are subjected to the logical operation by using a circuit configured by inverters 13a, 13b and NAND circuits 14a, 14b, each of the output signal OutP of a positive output terminal and the output signal OutM of a negative output terminal output via an output stage circuit 40 does not contain any output pulse. Thus, the power loss at the time of no input-signal can be reduced. However, in general, since there arises a dead zone near the input crossover due to the accuracy etc. of the comparators 12, the pulse signal output disappears or distortion appears at the time of inputting no signal or a small signal. Thus, the class D amplifier circuit 200 employs a delay circuit 30 having a delay amount W to thereby generate a signal Bd. Therefore, as shown in FIG. 5, since a pulse signal having a pulse width W is output as each of the output signals OutP, OutM at the time of no input-signal, the modulation width can be accurately reflected and the distortion can be reduced at the time of the small input signal.

As explained above, the distortion at the time of the small input signal can be reduced by outputting the pulse having the width W at the time of no input-signal. However, since a current flows into a load such as a speaker when the pulse width W of the output pulse is large, there arises the power loss and also heat generated by such the power loss can not be neglected. Accordingly, the pulse width W of the output pulse is required to be as small as possible, preferably.

Although the output pulses are output to the load (not shown) via the output stage circuit 40, in general the output stage circuit 40 is configured by buffers which are connected in a multi-stage manner. In this case, in order to transmit the output pulse correctly, the output pulse of the certain buffer is required to exceed the threshold voltage of the buffer of the next-stage.

However, if the waveform of the output pulse is dulled due to the input capacity of the buffer, the pulse cannot be transmitted sufficiently to the buffer of the next stage, there may arise a case that there appears no output pulse. When the output pulse disappears, the distortion is generated at the time of the small input signal. On the other hand, if the delay amount W of the delay circuit 30 is set to be large, at the time that the delay amount of the output stage circuit 40 becomes small due to a condition such as a power supply or the temperature, the pulse width W at the time of no input-signal becomes large. Thus, there arises a problem that the power loss at the load such as the speaker becomes large and an amount of the heat generated from the load increases.

SUMMARY OF THE INVENTION

The invention is made in view of the aforesaid problem and intended to realize the reduction of distortion and power loss at the time of inputting a small signal in a class D amplifier circuit.

In order to solve the aforesaid problem, the present invention provides the following arrangements.

(1) A class D amplifier circuit, comprising:

a pulse width modulator which pulse-width-modulates input signals to generate first and second signals, respectively;

a pulse generator which generates first and second output pulse signals to be output outside, based on the first and second signals; and an adjustor which adjusts pulse widths of the first and second output pulse signals so as to have predetermined widths respectively in a state where the input signal has no signal component, based on the first and second output pulse signals or a signal of a predetermined node of the pulse generator.

(2) The class D amplifier circuit according to (1), wherein the pulse generator includes:

a delay unit which delays the second signal to generate a delayed second signal and can control a delay time of the second signal;

a pulse signal generator which inputs the first signal and the delayed second signal to generate the first and second pulse signals; and a buffer unit which amplifies power of the first and second pulse signals to generate the first and second output pulse signals, respectively, and outputs the first and second output pulse signals to the outside, and the adjustor includes:

a pulse detector which detects presence or non-presence of a pulse in the first and second output pulse signals, or in a signal of a predetermined node of the buffer unit; and a delay time controller which controls the delay time of the delay unit according to a detection result of the presence or non-presence of the pulse.

(3) The class D amplifier circuit according to (2), wherein the delay time controller controls the delay time of the delay unit so as to be longer when the pulse is not detected, and controls the delay time of the delay unit so as to be shorter when the pulse is detected.

(4) The class D amplifier circuit according to (2), wherein the pulse detector detects the non-presence state of the pulse with a first period and detects the presence state of the pulse with a second period longer than the first period.

(5) The class D amplifier circuit according to (4), wherein the first and second periods are out of an audible frequency range.

(6) The class D amplifier circuit according to (1), wherein the pulse generator includes inverter buffers coupled in a multi-stage manner, and the predetermined node of the pulse generator being a node between the adjacent inverter buffers.

According to the invention, since the pulse widths of the first output pulse signal and the second output pulse signal are adjusted in accordance with the first output pulse signal and the second output pulse signal or the signal of the predetermined node of the pulse generator, the state where the output pulse does not exist at all can be prevented from occurring and the pulse width is set to be the necessary and sufficient minimum value. Thus, the reduction of the distortion and the power loss can be realized at the time of a small input signal.

According to the invention, since the first output pulse signal and the second output pulse signal or the signal of the predetermined node of the buffer unit is monitored, the presence or non-presence of the pulse in the first output pulse signal and the second output pulse signal can be directly or indirectly detected. Further, since the delay time is adjusted in accordance with the presence or non-presence of the pulses, the reduction of the distortion and the power loss can be realized at the time of a small input signal.

According to the present invention, the delay time controller controls the delay time of the delay unit so as to be longer when the pulse is not detected, and controls the delay time of the delay unit so as to be shorter when the pulse is detected. In this case, since the delay time of the delay unit is set to be longer when the pulse is not detected, the pulse can be made appear, and so the distortion can be reduced at the time of a small input signal. Further, since the delay time of the delay unit is set to be shorter when the pulse is detected, the pulse width can be made smaller and so the power loss can be reduced.

According to the present invention, the pulse detector detects the non-presence state of the pulse with a first period and detects the presence state of the pulse with a second period which is longer than the first period. In this case, since the non-presence state of the pulse can be detected earlier than the detection of the presence state of the pulse, it is possible to detect the disappearance of the pulse as early as possible to thereby surely reduce the distortion at the time of a small input signal. Furthermore, each of the first period and the second period is set to be out of the audible frequency range, so that the generation of noise due to the switching of the pulse width can be prevented.

DETAILED DESCRIPTION OF PREFERRED EMBODIMENTS

Figure 1:
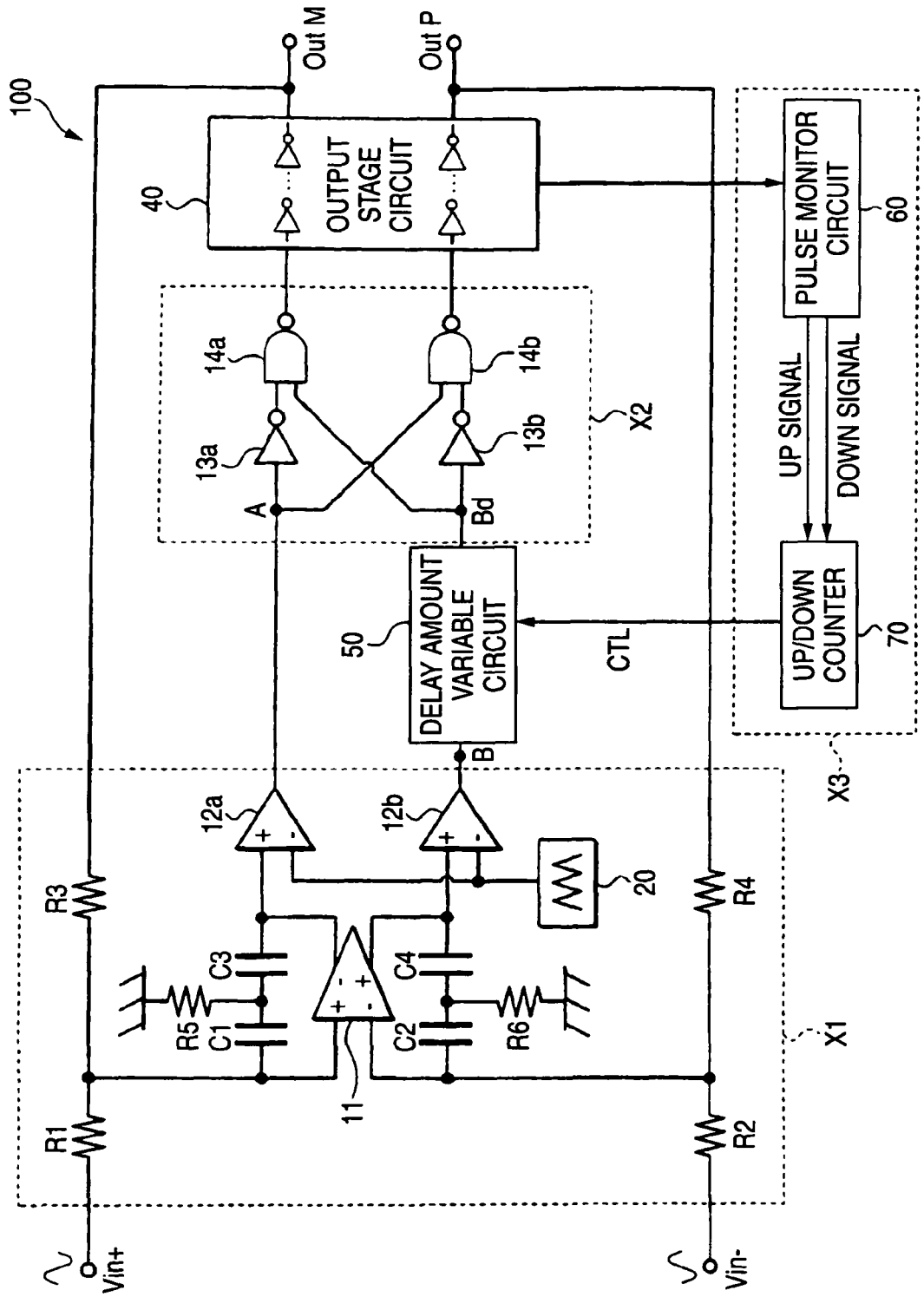
FIG. 1 is a block diagram showing the configuration of a class D amplifier circuit 100 according to an embodiment.
Figure 4:
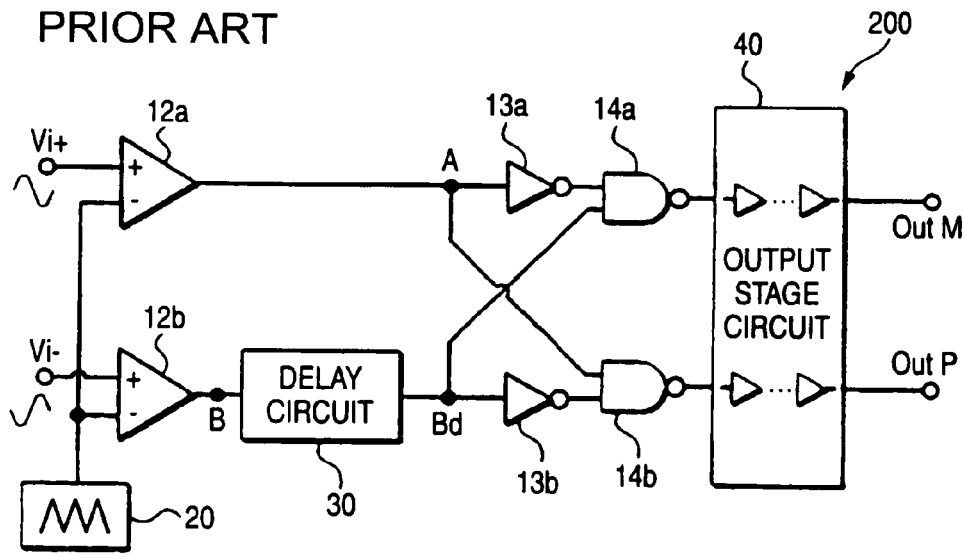
FIG. 4 is a block diagram showing the configuration of a class D amplifier circuit of a related art using a delay circuit.
Figure 5:
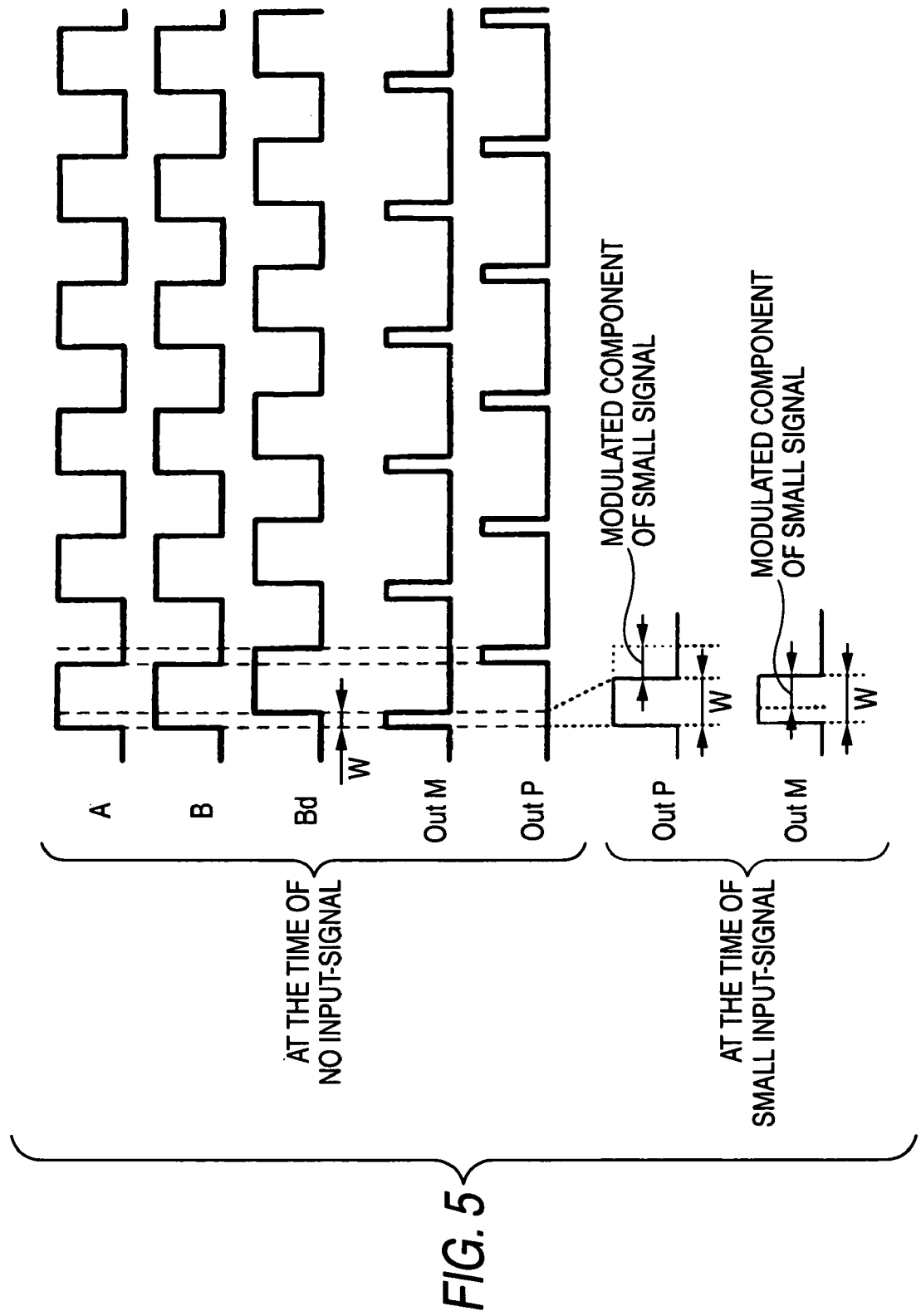
FIG. 5 is a diagram showing output pulses at a time of no input-signal and at a time of a small input signal.

An embodiment according to the invention will be explained with reference to the accompanying drawings. FIG. 1 is a block diagram showing the configuration of a class D amplifier circuit 100 according to the embodiment. In the figure, elements identical to those of FIG. 4 are referred to by the common symbols. As shown in this figure, the class D amplifier circuit 100 includes a positive input terminal, a negative input terminal, a positive output terminal and a negative output terminal. An input signal Vin+ is supplied to the positive input terminal and an input signal Vin− is supplied to the negative input terminal. A pulse width modulation signal Out P is output from the positive output terminal and a pulse width modulation signal Out M is output from the negative output terminal. That is, the input signals Vin are applied in a form of a differential input. The pulse width modulation signals Out P, OutM are coupled to a load such as a not-shown speaker. As a result, the load such as the speaker is operated by a difference signal of OutP and OutM. In this embodiment, although the amplifier circuit is configured as a filter-less type class D amplifier circuit which is coupled to the load by not using a low pass filter, the amplifier circuit may be configured as a normal type class D amplifier circuit which is coupled to the load via a low pass filter.

The class D amplifier circuit 100 includes a PWM signal generating portion X1 which is configured by resistors R1 to R6, capacitors C1 to C4, an operational amplifier 11, comparators 12a, 12b and a triangular wave generating circuit 20, a logic circuit portion X2 which is configured by inverters 13a, 13b and NAND circuits 14a, 14b, and an adjusting portion X3 which is configured by an output stage circuit 40, a delay amount variable circuit 50, a pulse monitor circuit 60 and an up/down counter 70.

In the PWM signal generating portion X1, the positive input terminal of the operational amplifier 11 is supplied with the input signal Vin+ via the resistor R1 and also a feedback signal via the resistor R3. The negative input terminal of the operational amplifier 11 is supplied with the input signal Vin− via the resistor R2 and also a feedback signal via the resistor R4. T-type secondary differentiating circuits are provided between the positive output terminal and the negative input terminal of the operational amplifier 11 and the negative output terminal and the positive input terminal of the operational amplifier, respectively. The differentiating circuit between the negative output terminal and the positive input terminal of the operational amplifier 11 is configured by the capacitors C1, C3 and the resistor R5 which is provided between the connection point between these capacitors and the ground. The differentiating circuit between the positive output terminal and the negative input terminal of the operational amplifier 11 is configured by the capacitors C2, C4 and the resistor R6 which is provided between the connection point between these capacitors and the ground. Since each of the differentiating circuits is provided in a feedback loop of the operational amplifier 11, the operational amplifier including the amplifier and the differentiating circuit acts as an integration circuit which composes the input signal Vin and the feedback signal, then subjects the composed signal to the secondary differentiation and outputs an integration signal.

The triangular wave generating circuit 20 generates a triangular wave signal having a constant amplitude range. The frequency of the triangular wave signal is set to be higher than that of the input signal Vin. In this embodiment, the maximum frequency of the input signal Vin is 20 KHz and the frequency of the triangular wave signal is 200 KHz. The spectrum of the triangular wave signal may be spread in a view point of reducing unnecessary electromagnetic radiation. The PWM signal generating portion generates a pulse-width modulated signal A and a pulse-width modulated signal B based on the triangular wave signal and the integration signal. Each of the comparators 12a, 12b outputs a high level when the level of the integration signal exceeds the level of the triangular wave signal, and outputs a low level when the level of the integration signal becomes lower than the level of the triangular wave signal.

Figure 2:
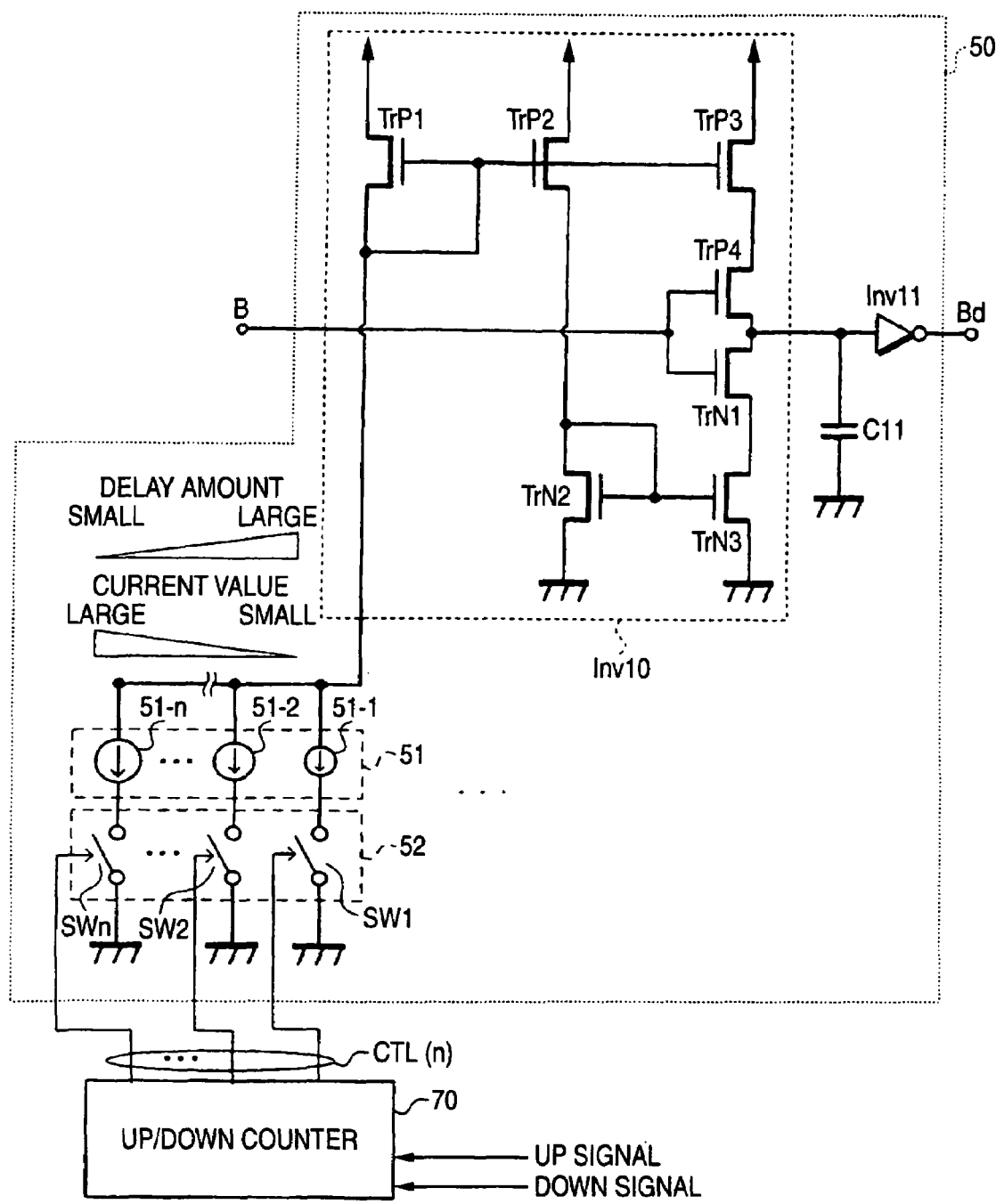
FIG. 2 is a block diagram showing an example of the configuration of a delay amount variable circuit and an up/down counter.

The delay amount variable circuit 50 delays the output signal B to generate an output Bd. The delay amount variable circuit 50 can change the delay amount in accordance with a control signal CTL from the up/down counter 70. FIG. 2 is a block diagram showing an example of the configuration of the delay amount variable circuit 50 and the up/down counter 70. The up/down counter 70 is a counter which counts a not-shown clock signal in a manner of increasing a count value when an up signal is made active, while reducing the count value when a down signal is made active. The up/down counter 70 outputs the control signal CTL of n bits (n is a natural number equal to or more than 2) representing the count value to the delay amount variable circuit 50.

The delay amount variable circuit 50 includes an inverter Inv10 configured by transistors TrP1 to TrP4 and transistors TrN1 to TrN3, a capacitor C11, an inverter Inv11, a constant current circuit 51 and a selection circuit 52. The inverter Inv10 charges and discharges the capacitor C11 and the magnitude of a driving signal for the capacitor is determined in accordance with a current flowing through the transistor TrP1. When the driving current becomes large, since the charge/discharge time period of the capacitor C11 becomes short, the delay time of the delay amount variable circuit 50 becomes short. In contrast, when the driving current becomes small, since the charge/discharge time period of the capacitor C11 becomes long, the delay time of the delay amount variable circuit 50 becomes long.

The constant current circuit 51 and the selection circuit 52 have a function of adjusting an amount of the current flowing into the transistor TrP1. The constant current circuit 51 includes n constant current sources 51-1, 51-2, ... 51-$n$, and the selection circuit 52 includes n switches SW1, SW2, ... SWn. The on/off states of the n switches SW1 to SWn are controlled by the respective bits of then n-bit control signal CTL, respectively. In this embodiment, the current amounts of the constant current sources 51-1 to 51-$n$ are set to be larger as the suffixes thereof becomes larger. The control signal CTL controls the switches SW1 to SWn in a manner that the constant current source outputting a smaller current value is selected from the constant current sources 51-1 to 51-$n$ as the count value of the up/down counter 70 is larger and that the constant current source outputting a larger current value is selected from the constant current sources 51-1 to 51-$n$ as the count value of the up/down counter 70 is smaller.

The configuration of the delay amount variable circuit 50 shows merely an example, and the invention may employ the delay amount variable circuit having various kinds of configuration so long as the delay amount can be changed in accordance with the count value of the up/down counter 70.

The explanation will be returned to FIG. 1. The logic circuit portion X2 inputs the output signal A and the output signal Bd which is obtained by delaying the output signal B by the delay amount variable circuit 50, and outputs an NAND signal which is obtained by subjecting the inverted signal of the output signal A and the output signal Bd to the NAND logical operation and also outputs an NAND signal which is obtained by subjecting the output signal A and the inverted signal of the output signal Bd to the NAND logical operation. The external load such as the speaker is driven by the difference between these NAND signals. The output stage circuit 40 is configured by coupling the inverter buffers in a multi-stage manner.

The pulse monitor circuit 60 detects the presence or non-presence of the output pulse output from the output stage circuit 40 and outputs the up signal or the down signal to the up/down counter 70 in accordance with the detection result. To be concrete, the pulse monitor circuit outputs the down signal when the output pulses are detected, and outputs the up signal when the output pulses are not detected. That is, in this embodiment, the delay amount is made small to narrow the output pulse width when the output pulses are detected, while the delay amount is made large to widen the output pulse width when the output pulses are not detected.

Alternatively, the pulse monitor circuit 60 may monitor the signal of a node between the adjacent buffers of the output stage circuit 40 to detect the present or non-presence of the output pulse.

Figure 3:
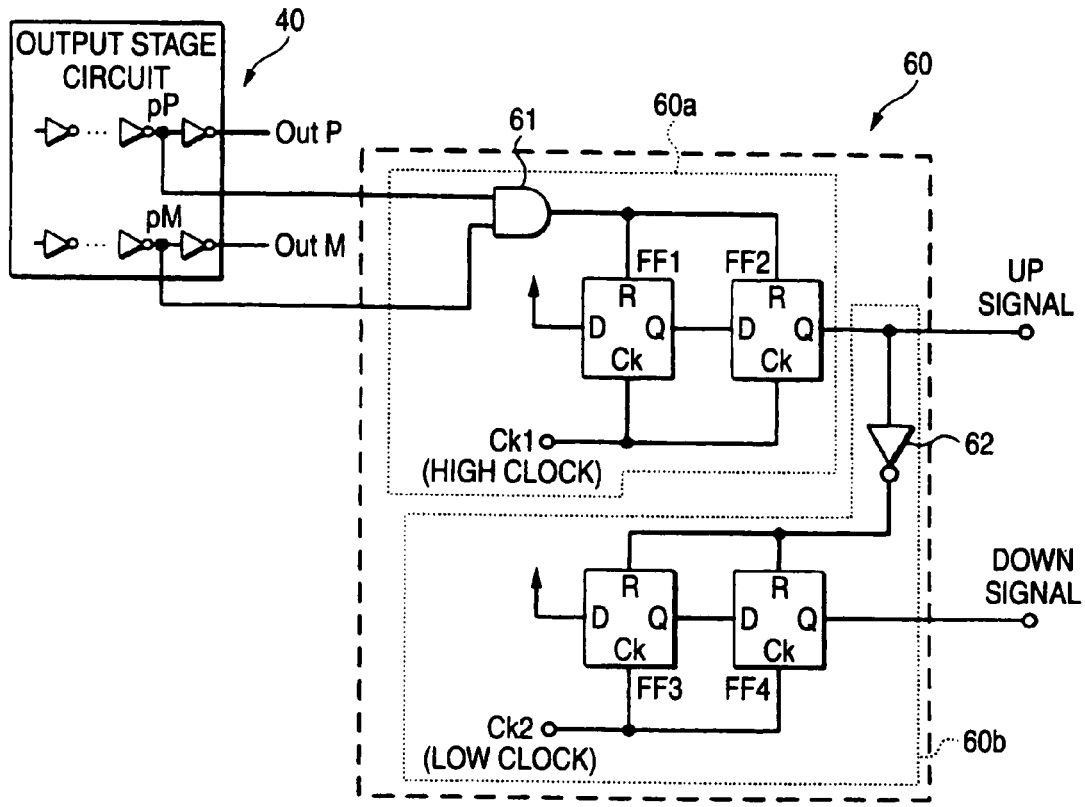
FIG. 3 is a block diagram showing an example of the configuration of the pulse monitor circuit

FIG. 3 is a block diagram showing an example of the configuration of the pulse monitor circuit 60. The pulse monitor circuit 60 is configured by an up signal generating portion 60a for generating the up signal and a down signal generating portion 60b for generating the down signal. In this embodiment, pulses pP, pM input into the inverters of the final stage of the multi-stage buffers of the output stage circuit 40 are output to an AND circuit 61 of the up signal generating portion 60a.

Thus, the AND circuit 61 outputs a reset signal of a low level when at least one of the pulses pP, pM, which are respectively inverted signals of the output pulses OutP, OutM, becomes a low level. The reset signal is supplied to the reset terminals of D flip-flops FF1, FF2. Each of the D flip-flops FF1, FF2 sets the logical level of the output signal thereof to a low level forcedly when the voltage of the reset terminal thereof becomes the low level. Thus, when each of the output pulses OutP, OutM is the low level and so there exists no pulse during two periods of a clock signal Ck1, the up signal becomes the high level.

An inverter 62 inverts the up signal and supplies the inverted up signal to the reset terminals of the D flip-flops FF3, FF4. Each of the D flip-flops FF3, FF4 sets the logical level of the output signal thereof to a low level forcedly when the voltage of the reset terminal thereof becomes the low level. Thus, when the output pulses OutP, OutM alternatively exhibit a high-level pulse, that is, when the up signal does not becomes the high level at all during two periods of a clock signal Ck2, the down signal becomes the high level.

In this case, the frequency of the clock signal Ck1 is set to be sufficiently larger than that of the clock signal Ck2. For example, the frequency of the clock signal Ck1 is set to be 100 KHz and the frequency of the clock signal Ck2 is set to be 1 Hz. The frequency of each of these clock signals is out of the audible frequency range (20 Hz to 20 KHz). The reason why the frequency of the clock signal Ck1 is set to be 20 KHz or more and the frequency of the clock signal Ck2 is set to be 20 Hz or less is as follows. That is, when the up signal or the down signal becomes the high level, the pulse widths of the output pulses OutP, OutM are changed or the output pulses OutP, OutM are generated. As a result, when the switching of the up signal or the down signal is within the audible frequency range, the noise arises. Thus, the frequency of each of the clock signal Ck1 and the clock signal Ck2 is set out of the audible frequency range.

Further, since the frequency of the clock signal Ck1 is set to be quite larger than that of the clock signal Ck2, the up signal is output immediately when the output pulses OutP, OutM disappear, while the down signal is slowly output relatively when the output pulses OutP, OutM appear. Thus, the time period where the output pulses OutP, OutM disappear can be made as small as possible, so that the distortion can be suppressed from being generated at the time of the small input signal. Further, when the output pulses are detected, since the delay amount is controlled to be made small, that is, the output pulse width is controlled to be made short, the output pulse width can be kept to almost the minimum value. Thus, the reduction of the distortion and the lower loss at the time of the small input signal can be realized.

According to the aforesaid configuration, the following operation is performed by the embodiment. That is, the pulse monitor circuit 60 detects the presence or non-presence of the output pulses OutP, OutM output from the output stage circuit 40. The pulse monitor circuit 60 outputs the up signal to the up/down counter 70 when none of the output pulses OutP, OutM exist and outputs the down signal to the up/down counter 70 when the output pulses OutP, OutM exist. The up/down counter 70 counts the value in accordance with the up signal and the down signal, and outputs the signal for increasing the delay amount of the delay amount variable circuit 50 when the count value is large, that is, when the output pulses OutP, OutM disappear. In this case, the delay amount is set to be larger as the time period where none of the output pulses OutP, OutM exist becomes longer. In contrast, when the count value is small, that is, when the output pulses OutP, OutM exist, the counter outputs the signal for reducing the delay amount of the delay amount variable circuit 50. In this case, the delay amount is set to be smaller as the time period where the output pulses OutP, OutM exist becomes longer.

When the delay amount of the delay amount variable circuit becomes larger, since the output pulse width is made larger, the output pulses OutP, OutM appear. In contrast, when the delay amount of the delay amount variable circuit 50 becomes smaller, the output pulse width is made smaller. In this embodiment, since such the control is performed continuously, the state where the output pulse does not exist at all can be prevented from occurring also at the time of the no input-signal. Thus, the distortion at the time of the small input signal can be reduced. Further, since the pulse width is set to be the necessary and sufficient minimum value, the reduction of the power loss can be realized.

What is claimed is:

1. A class D amplifier circuit, comprising:
   a pulse width modulator which pulse-width-modulates input signals to generate first and second signals;
   a delay unit which delays the second signal for a variable delay time to generate a delayed second signal;
   a buffer unit which outputs first and second output pulse signals based on the first signal and the delayed second signal; and
   a pulse monitor circuit which detects presence or non-presence of a pulse in each of the first and second output pulse signals, or in signals associated with the first and second output pulse signals at defined nodes of the buffer unit; and
   a delay time controller which controls the variable delay time of the second signal to be longer when no pulse is detected by the pulse monitor circuit and controls the variable delay time to be shorter when the pulse is detected by the pulse monitor circuit.

2. The class D amplifier circuit according to claim 1, wherein
   pulse widths of the first and second output pulse signals are adjusted so as to have predetermined widths respectively in a state where the input signals have no signal component.

3. The class D amplifier circuit according to claim 1, wherein
   the buffer unit includes a first signal path for generating and outputting the first output pulse signal to outside and a second signal path for generating and outputting the second output pulse signal to outside; and
   wherein the defined nodes of the buffer unit are in the first signal path and the second signal path.

4. The class D amplifier circuit according to claim 3, wherein the pulse monitor circuit detects the non-presence of the pulse when a signal of the defined node of the first signal path has no pulse component and a signal of the defined node of the second signal path has no pulse component.

5. The class D amplifier circuit according to claim 1, wherein the buffer unit includes a plurality of inverter buffers coupled in a multi-stage manner, and the defined nodes are nodes between adjacent inverter buffers.

6. A class D amplifier circuit comprising:
   a pulse width modulator which pulse-width-modulates input signals to generate first and second signals;
   a delay unit which delays the second signal for a variable delay time to generate a delayed second signal;
   a buffer unit which outputs first and second output pulse signals based on the first signal and the delayed second signal; and
   a pulse monitor circuit which detects presence or non-presence of a pulse in each of the first and second output pulse signals, or in signals associated with the first and second output pulse signals at defined nodes of the buffer unit, the pulse monitor circuit detecting the non-presence of the pulse by using a first clock signal with a first frequency and detecting the presence of the pulse by using a second clock signal with a second frequency lower than the first frequency; and
   a delay time controller which controls the variable delay time of the second signal according to a detection result of the presence or non-presence of the pulse.

7. The class D amplifier circuit according to claim 3, wherein the first frequency and the second frequency are set outside of an audible frequency range.

8. The class D amplifier circuit according to claim 6, wherein
   the delay time controller controls the variable delay time to be longer when the pulse is not detected, and controls the delay time to be shorter when the pulse is detected.

9. The class D amplifier circuit according to claim 6, wherein
   the buffer unit includes a plurality of inverter buffers coupled in a multi-stage manner, and the defined nodes are nodes between adjacent inverter buffers.

10. The class D amplifier circuit according to claim 6, wherein
   pulse widths of the first and second output pulse signals are adjusted so as to have predetermined widths respectively in a state where the input signals have no signal component.

11. The class D amplifier circuit according to claim 6, wherein the buffer unit includes a first signal path for generating and outputting the first output pulse signal to outside and a second signal path for generating and outputting the second output pulse signal to outside; and wherein the defined nodes of the buffer unit are in the first signal path and the second signal path.

12. The class D amplifier circuit according to claim 1, wherein the pulse monitor circuit detects the non-presence of the pulse when the first output pulse signal has no pulse component and the second output pulse signal has no pulse component.

13. A class D amplifier circuit comprising:
a pulse width modulator which pulse-width-modulates input signals to generate first and second signals;
a delay unit which delays the second signal for a variable delay time to generate a delayed second signal;
a buffer unit which outputs first and second output pulse signals based on the first signal and the delayed second signal; and
a pulse monitor circuit which detects presence or non-presence of a pulse in each of the first and second output pulse signals, or in signals associated with the first and second output pulse signals at defined nodes of the buffer unit; and
a delay time controller which controls the variable delay time of the second signal according to a detection result of the presence or non-presence of the pulse, wherein
the buffer unit includes a plurality of inverter buffers coupled in a multi-stage manner, and the defined nodes are nodes between adjacent inverter buffers.

* * * * *